(12) United States Patent
Ingalls

(10) Patent No.: US 11,342,014 B1
(45) Date of Patent: May 24, 2022

(54) DRIVER LEAKAGE CONTROL

(71) Applicant: Micron Technology, Inc., Boise, ID (US)

(72) Inventor: Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/306,311

(22) Filed: May 3, 2021

(51) Int. Cl.
*G11C 8/08* (2006.01)
*G11C 8/10* (2006.01)

(52) U.S. Cl.
CPC . *G11C 8/08* (2013.01); *G11C 8/10* (2013.01)

(58) Field of Classification Search
CPC .................................... G11C 8/08; G11C 8/10
USPC .................................................... 365/230.06
See application file for complete search history.

(56) References Cited

U.S. PATENT DOCUMENTS

| | | | |
|---|---|---|---|
| 2001/0014042 A1* | 8/2001 | Kato | G11C 11/4074 365/200 |
| 2005/0128852 A1* | 6/2005 | Deng | G11C 7/22 365/226 |
| 2007/0070783 A1* | 3/2007 | Lee | G11C 8/10 365/230.06 |

* cited by examiner

*Primary Examiner* — Anthan Tran
(74) *Attorney, Agent, or Firm* — Fletcher Yoder, P.C.

(57) ABSTRACT

Embodiments herein relate to column select circuitry of a memory device. Specifically, the column select circuitry includes a pre-header circuit coupled to a pre-driver circuit. The pre-header circuit is configured to couple a gate of a transistor of a main column select driver circuit of the column select circuitry to a first voltage supply during operation and a second voltage supply when in a standby state. A voltage of the second voltage supply is greater than a voltage of the first voltage supply. The voltage of the second power supply applied to the gate of the transistor of the main column select driver circuit reduces current leakage through the transistor and enables a reduction in a size of the column select circuitry.

20 Claims, 4 Drawing Sheets

DRIVER LEAKAGE CONTROL

BACKGROUND

The present disclosure generally relates to computing systems and, more particularly, to improving an operating efficiency and minimum size of column select (and/or row select) driver circuitry of a memory architecture.

Generally, a computing system includes a host sub-system and a memory sub-system. The memory sub-system may store data accessible to processing circuitry of the host sub-system. For example, to perform an operation, the processing circuitry may execute instructions retrieved from a memory device implemented in the memory sub-system. In some instances, input data for the operation may also be retrieved from the memory device. Additionally or alternatively, data output (e.g., resulting) from the operation may be stored in the memory device, for example, to enable subsequent retrieval. However, in some instances, operational efficiency of the computing system may be limited by the architecture of the memory sub-system and, in particular, to circuitry related to the column-select operation for retrieving data stored in the memory device.

BRIEF DESCRIPTION OF THE DRAWINGS

Various aspects of the present disclosure may be better understood upon reading the following detailed description and upon reference to the drawings described below.

DETAILED DESCRIPTION

Figure 1:
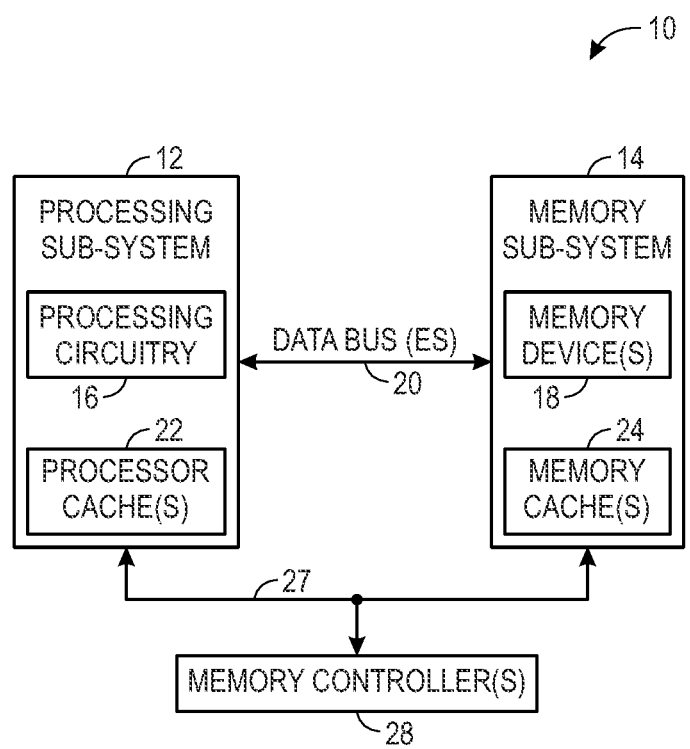
FIG. 1 is a block diagram of an example computing system including a host (e.g., processing) sub-system and a memory sub-system, in accordance with an embodiment of the present disclosure.

The present disclosure provides apparatus and techniques that facilitate improved operating efficiency and/or operating performance of computing systems, for example, by mitigating leakage current caused by one or more column select drivers of a memory sub-system without increasing a physical size of the computing system.

A computing system generally includes various computing sub-systems, such as a host (e.g., processing) sub-system and a memory sub-system. The host sub-system may include processing circuitry, for example, implemented in one or more processors and/or one or more processor cores. The memory sub-system may include one or more memory devices (e.g., chips or integrated circuits), for example, implemented on a memory module, such as a dual in-line memory module (DIMM), and/or organized to implement one or more memory arrays (e.g., banks of memory cells).

Generally, during operation of the computing system, processing circuitry implemented in the processing sub-system may perform various operations by executing instructions stored in the memory sub-system. For example, the processing sub-system may determine output data by executing a data processing operation based on input data. Additionally, a processing sub-system may generally include one or more registers and/or one or more processor-side caches, which provide storage locations directly accessible to the processing sub-system. However, storage capacity implemented in a processing sub-system is generally limited.

As such, the processing sub-system is often communicatively coupled to a memory sub-system via one or more memory buses (e.g., external communication, command, and/or data buses). In some cases, a computing system may include multiple memory buses, for example, each dedicated to different types of communication. For example, the computing system may include a memory command (e.g., control and/or request) bus dedicated to communication of command (e.g., control) signals indicative of memory access command (e.g., a memory read or write command), a memory data bus dedicated to communication of data signals indicative of a data block to be stored (e.g., written) in a memory device of the memory sub-system (e.g., in response to a memory write command and/or a memory read command).

Moreover, in some instances, memory in a memory sub-system may be implemented using multiple different memory types. For example, the memory sub-system may include one or more volatile memory devices, such as a dynamic random-access memory (DRAM) device and/or a static random-access memory (SRAM) device, one or more non-volatile memory devices, such as a flash (e.g., NAND) memory device, a phase-change memory (e.g., 3D XPoint™) device, and/or a ferroelectric random access memory (FeRAM) device.

The memory device(s) in a memory sub-system generally includes memory cells organized into one or more memory arrays (e.g., banks) and coupled to memory array control circuitry. The memory array control circuitry may include row select (e.g., decoder) circuitry and column select (e.g., decoder) circuitry. More specifically, the cells of a memory array may be coupled to word lines formed in a first (e.g., horizontal) direction and bit lines formed in a second (e.g., vertical) direction, orthogonal to the first direction. In other words, at least in some instances, the memory cells in a memory array may be organized into one or more memory cell rows, for example, which each corresponding with a memory page (e.g., word).

Upon receiving an address (e.g., a row and column) of the memory cell from which data is to be read (e.g., retrieved) and/or to which data is to be written, the row select circuitry and the column select circuitry may be used to identify the specific memory cell and enable a read and/or write operation. However, the row select circuitry and the column select circuitry may reduce an operational efficiency of the memory sub-system, and thus the computing system due to leakage current through components of the row and column select circuitry when active (e.g., during a read and/or write operation) or not.

Furthermore, while some components of the column (and row) select circuitry are common to more than one memory cell, other components are duplicated for each memory cell of the memory device. For example, various transistors of the column select circuitry may be duplicated for each memory cell of the memory device. Thus, a size of the duplicated transistor may be multiplied many times (e.g., about 35,000 times—one for each of 1122 memory cells of 32 memory devices) which could have a relatively significant impact on a minimum size of the memory sub-system and the computing system.

Embodiments presented herein provide apparatus and techniques to improve an operating performance and efficiency of a computing system by reducing an occurrence of a leakage current through the column (and/or row) select circuitry. Further, embodiments presented herein may enable reduction of a size of the column (and/or row) select circuitry and thus reduction of a minimum size of the computing system. To do so, the column select circuitry may include a pre-driver circuit to control the main column select driver. The pre-driver circuit enables a physical size of the main driver circuit to be reduced while maintaining or improving operation performance of the column select circuitry.

FIG. 1 is a block diagram of an example of a computing system 10 (e.g., an apparatus), which includes a processing (e.g., host) sub-system 12 and a memory sub-system 14, according to an embodiment of the present disclosure. The computing system 10 may include other computing sub-systems not shown in FIG. 1 such as a networking sub-system, a communication sub-system, a radio frequency sub-system, a user input sub-system, a display sub-system, or a combination thereof.

In some embodiments, the computing system 10 may be implemented in a single electronic device, such as a desktop computer, a workstation computer, a laptop computer, a server, a mobile phone, a virtual-reality headset, and/or the like. In other embodiments, the computing system 10 may be distributed between multiple electronic devices. For example, the processing sub-system 12 and the memory sub-system 14 may be implemented in a host device while other computing sub-systems, such as the user input and/or display sub-systems, may be implemented in a client (e.g., remote) device. In some embodiments, a computing sub-system may be distributed between multiple electronic devices. For example, a first portion of the processing sub-system 12 and/or a first portion of the memory sub-system 14 may be implemented in a host device while a second portion of the processing sub-system 12 and/or a second portion of the memory sub-system 14 may be implemented in a client device.

As shown, the processing sub-system 12 may include processing circuitry 16. The processing circuitry 16 may include one or more central processing units (CPUs), one or more graphics processing units (GPUs), one or more processor cores, or any combination thereof. During operation, the processing sub-system 12 may perform various operations such as determining output data by executing, via the processing circuitry, instructions to perform a data processing operation based on input data. The processing sub-system 12 may also include one or more caches 22 which may be integrated with the processing circuitry 16. The one or more caches 22 may provide storage locations directly accessible to the processing circuitry 16. To control storage of the one or more caches 22, the processing sub-system 12 may be coupled to one or more memory controllers 28 via one or more buses 27.

The memory sub-system 14 generally stores data accessible by the processing sub-system 12 via one or more memory devices 18. The memory devices 18 may include integrated circuits or chips with one or more memory cells (e.g., circuitry) organized into one or more memory arrays and thus, may include one or more tangible, non-transitory, computer-readable media. For example, the memory sub-system 14 may include one or more dynamic random-access memory (DRAM) devices, one or more static random-access memory (SRAM) devices, one or more flash (e.g., NAND) memory devices, one or more phase-change memory (e.g., 3D XPoint™) memory devices, one or more ferroelectric random access memory (FeRAM), or any combination thereof.

In some embodiments, multiple memory devices 18 may be implemented on a memory module, such as a dual in-line memory module (DIMM) or a single in-line memory module (SIMM). For example, a memory module may include a printed circuit board (PCB) and multiple memory devices 18 each disposed on a flat or planar (e.g., front or back) surface of the printed circuit board. Additionally, the memory devices 18 may be coupled to external pins formed along an (e.g., bottom) edge of the printed circuit board via conductive traces formed on the printed circuit board.

It should be understood that one or more of the memory devices 18 may be implemented using other packing techniques. For example, the memory devices 18 may be coupled to a (e.g., silicon) interposer to implement a 2.5D configuration. Additionally or alternatively, the memory devices 18 may be stacked to implement a 3D configuration. Furthermore, in some embodiments, the memory devices 18 may be implemented using organic packaging techniques. In other words, the techniques described in the present disclosure may be implemented as an on-package solution.

The memory sub-system 14 also includes one or more memory caches 24. Although implemented in the memory sub-system 14, the memory cache 24 may nevertheless provide faster data communication compared to a memory array implemented in the memory devices 18. For example, the memory cache 24 may be implemented with static random-access memory (SRAM) while the memory devices 18 may be implemented with dynamic random-access memory (DRAM). Additionally or alternatively, a memory cache 24 and a memory array implemented in the one or more memory devices 18 may utilize the same memory type (e.g., DRAM). In fact, in some embodiments, one or more of the memory caches 24 may be implemented in the memory devices 18. To control storage of the one or more memory caches 24, the memory sub-system 14 may be coupled to the one or more memory controllers 28 via the one or more buses 27.

As shown, the processing sub-system 12 is communicatively coupled to the memory sub-system 14 via one or more memory buses 20. The data buses 20 may include one or more cables, one or more wires, one or more conductive traces, one or more communication networks, or any combination thereof. Each of the one or more memory buses 20 may be dedicated to different communication types between the memory sub-system 14 and the processing sub-system 12. For example, the memory buses 20 may include a memory command bus and a memory data bus.

Figure 2:
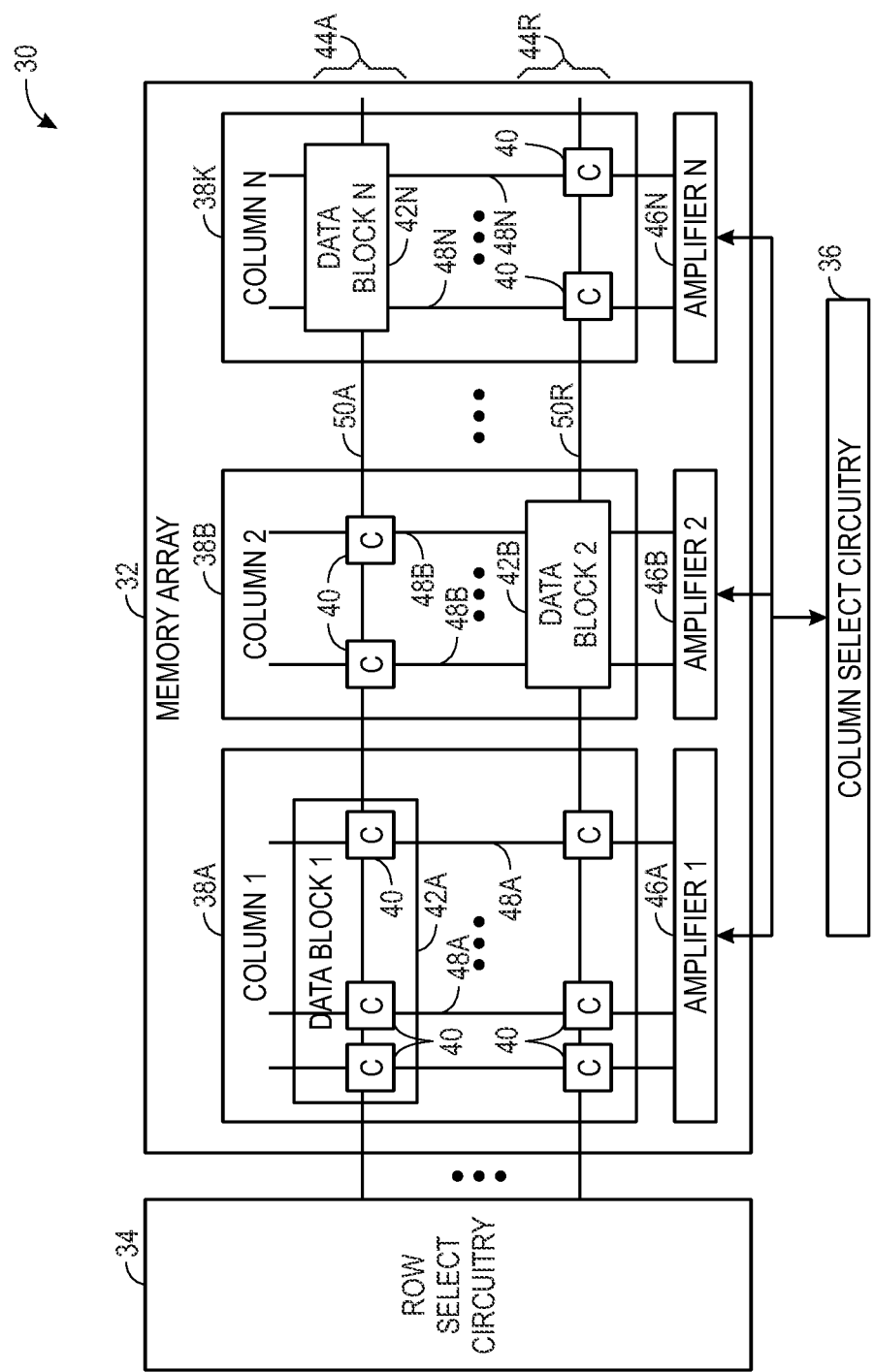
FIG. 2 is a block diagram of example circuitry of a memory array implemented in the memory sub-system of FIG. 1, in accordance with an embodiment of the present disclosure.

FIG. 2 is a block diagram of example circuitry 30 of a memory array 32 implemented in the memory sub-system 14 of FIG. 1, in accordance with an embodiment of the present disclosure. In some embodiments, the memory array 32 may be disposed within a memory device 18 of the memory sub-system 14 of FIG. 1. In some embodiments, the memory array 32 may be accessed by the memory devices 18 of the memory sub-system 14.

As shown, the example circuitry 30 includes a row select (e.g., decoder) circuitry 34 and a column select (e.g., decoder) circuitry 36. The memory array 32 may include a plurality of memory cells 40 coupled to the row select circuitry 34 via word lines 50 formed in a first direction (e.g., horizontal). The memory cells 40 may also be coupled to the column select circuitry 36 (e.g., via the amplifier circuitry 46) via bit lines 48 formed in a second direction (e.g., vertical), orthogonal to the first direction.

The memory cells 40 of the memory array 32 may be organized into one or more memory cell rows 44 identified by a corresponding row (e.g., page) address and one or more memory cell columns 38 identified by a corresponding column address. In some embodiments, a memory cell row 44 may include each of the memory cells 40 coupled to a (e.g., one) word line 50. For example, a first memory cell row 44A may include each of the memory cells 40 coupled to a first word line 50A. Similarly, an Rth memory cell row 44R may include each of the memory cells 40 coupled to an Rth word line 50R.

Organizing the memory array 32 in this manner enables the memory cells 40 to be grouped into storage locations suitable for storage of bit groups 42. For example, a first bit group 42A may be stored at a first storage location including the memory cells 40 in the first memory cell row 44A and a first memory cell column 38A, a second bit group 42B may be stored at a second storage location including the memory cells 40 in the Rth memory cell row 44R and a second memory cell column 38B, and a Nth bit group 42N may be stored at an Nth storage location including the memory cells 40 in the first memory cell row 44A and the Nth memory cell column 38N.

In some embodiments, each memory cell 40 may include a switching component (not shown), such as a metal-oxide-semiconductor field-effect transistor (MOSFET), and a storage component (not shown), such as a capacitor. For example, a memory cell 40 may be implemented such that a corresponding MOSFET is coupled between a bit line 48 and a corresponding storage capacitor and the gate of the corresponding MOSFET is coupled to a word line 50. Thus, to enable reading from and/or writing to a specific memory cell 40, the row select circuitry 34 may activate the specific memory cell 40, for example, by outputting an activation signal (e.g., logic high, 1) via a corresponding word line 50 that causes the switching component of the memory cell 40 to electrically couple the storage component of the memory cell 40 to a corresponding bit line 48.

Each memory cell 40 may store one bit of data. For example, a memory cell 40 may indicate a logic high bit (e.g., 1) when charge stored in the memory cell 40 results in a voltage greater than a threshold voltage. On the other hand, the memory cell 40 may indicate a logic low bit (e.g., 0) when charge stored in the memory cell 40 results in a voltage less than the threshold voltage. In some embodiments, the amplifier circuitry 46 may include a driver (not shown) to facilitate storing (e.g., writing) data in the memory cells 40 and/or sense amplifier (not shown) to facilitate outputting (e.g., reading) data from the memory cells 40.

Additionally, in some embodiments, the column select circuitry 36 may selectively enable access to (e.g., reading from and/or writing to) a storage location in an activated memory page (e.g., memory cell row 44), for example, by outputting a column select signal (e.g., a logic high) to a corresponding amplifier circuitry 46. For example, to read bits from and/or to write bits to a storage location in the first memory cell column 38A (e.g., the first bit group 42A), the column select circuitry 36 may output a column select signal to the first amplifier circuitry 46A. Similarly, to read bits from or write bits to a storage location in the second memory cell column 38B (e.g., the second bit group 42B), the column select circuitry 36 may output a column select signal to the second amplifier circuitry 46B. Furthermore, to read data from and/or write bits to a storage location in the Nth memory cell column 38N, the column select circuitry 36 may output a column select signal to the Nth amplifier circuitry 46N. In this manner, the memory cells 40 in the one or more memory devices 18 may be organized to implement a memory array 32 in the memory sub-system 14.

Figure 3:
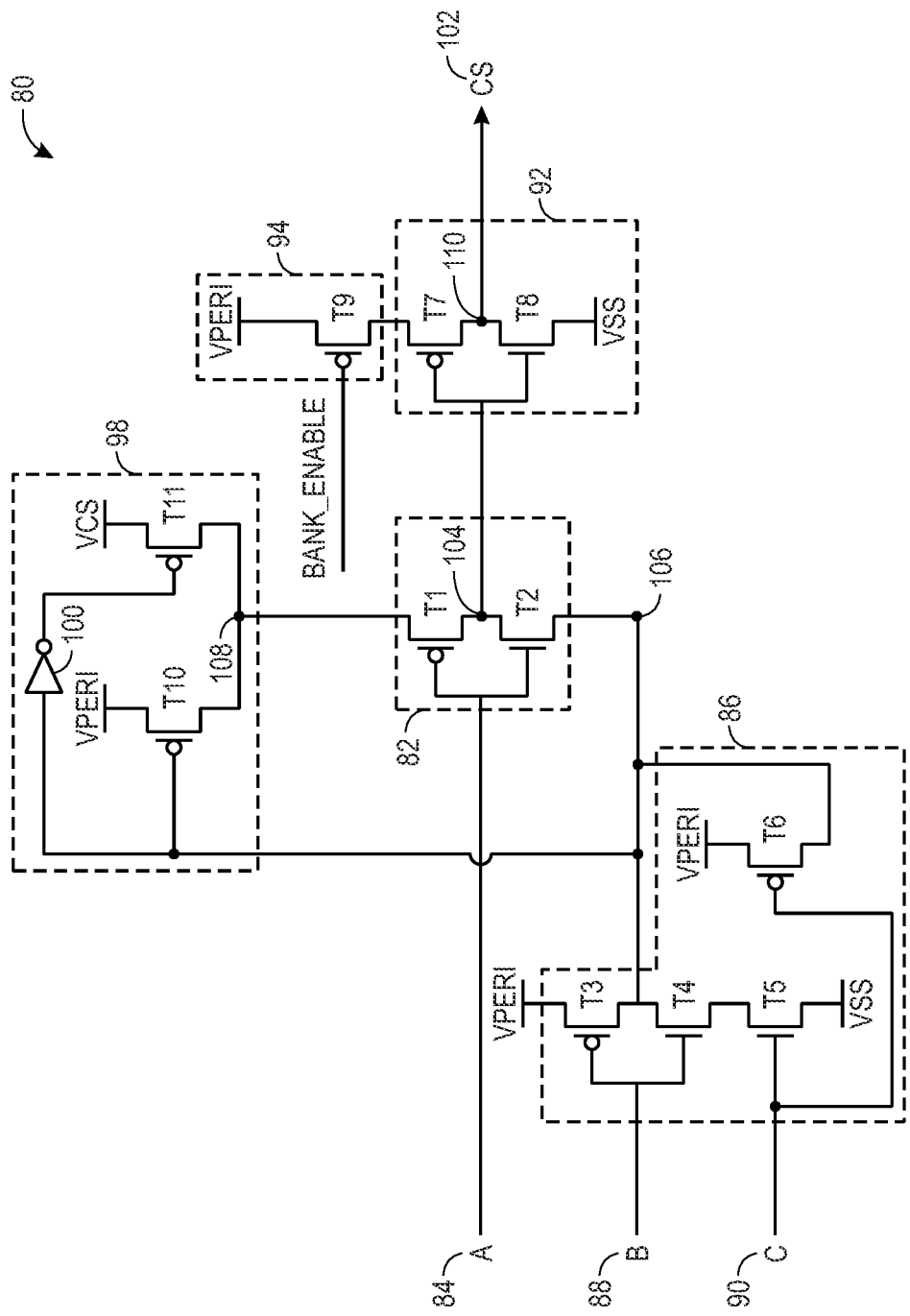
FIG. 3 is a circuit diagram of example column select circuitry including pre-header circuitry, in accordance with an embodiment of the present disclosure.

FIG. 3 is a circuit diagram of example column select circuitry 80 including a pre-header circuit 98, in accordance with an embodiment of the present disclosure. The example column select circuitry 80 includes a pre-driver 82, a decoder 86, a main driver 92, a column select header 94, and a pre-header 98. The pre-driver 82 includes transistors T1 and T2. The decoder 86 includes transistors T3, T4, T5, and T6. The main driver 92 includes transistors T7 and T8. The column select header 94 includes a transistor T9. The pre-header 98 includes transistors T10 and T11 and an inverter 100. As illustrated, the transistors T1, T3, T6, T7, T9, T10, and T11 may be p-channel transistors while the transistors T2, T4, T5, and T8 may be n-channel transistors. It should be understood that the transistors T1-T11 may be different types (n-channel or p-channel) and may be disposed in a different configuration than shown.

In some embodiments, the example column select circuitry 80 may correspond to the column select circuitry 36 discussed with respect to FIG. 2. That is, the column select circuitry 80 may receive an address of a memory cell 40 from which data is to be read (e.g., retrieved) and/or to which data is to be written. It should be understood that the example column select circuitry 80 represents a column select circuitry for a particular column 38 of the memory array 32. Further, while the components and techniques discussed with respect FIG. 3 are related to the column select circuitry 36 it should be understood that the same or similar components and/or techniques may be used with the row select circuitry 34.

In some embodiments, some components of the column select circuitry 80 may be common to all columns 38 of the memory array 32 while other components may be specific to a particular column 38 or a group of columns 38 of the memory array 32. For example, the column select header 94 may be coupled to each column 38 of a memory array 32 while the pre-header 98 may be coupled to eight columns 38. Thus, in the case of a memory array 32 having 1024 columns, the column select circuitry 36 may include one column select header 94 and 128 pre-headers 98.

A size of the transistor T7 may have a first size (e.g., a minimum width) of about 10.6 microns (e.g., μm). The transistors T10 and T11 may have a second size of less than about 1.5 microns, for example about 1 micron. That is, the size of the transistor T7 may be reduced from an original size by about 7 microns, compared to previous designs. Thus, an original size of the transistor T7 may be about 17.6 microns. Accordingly, an overall size of the column select circuitry 80 may be reduced by about 7168 microns (e.g., 7.168 mm) determined by 7 microns per column select circuitry for each column 38 (e.g., 7 microns×1024 columns=7168 microns) in the presently disclosed embodiments. An added size of the transistors T10 and T11 of the pre-header 98 is about 256 microns determined by 2 microns per 8 columns (1024 columns÷8=128; 2 microns×128=256 microns). Accordingly, an overall size reduction of the column select circuitry is about 6912 microns per memory array 32, compared to prior designs.

The column select circuitry 80 receives one or more input signals (e.g., addresses) A 84, B 88, and C 90. When the input signal A 84 is a logic low (e.g., 0), the column select circuitry may be in a standby (e.g., off) state.

When no column is enabled (e.g., A 84, B 88, and C 90 are a logic low), a first node 104 is coupled to an internally generated logic high peripheral voltage VPERI via the transistors T1 and T10. Thus, the logic high voltage VPERI is applied to a gate of the transistor T7. Further, when no column is enabled, a logic low (e.g., 0) bank enable signal is applied to a gate of the transistor T9. Thus, the logic high voltage VPERI is also applied to a drain of the transistor T7. Even though the transistor T7 is off due to the logic high voltage VPERI applied to the gate thereof via the transistors T1 and T10, some leakage current occurs through the transistor T7 due to the voltage difference between the source and drain thereof. To mitigate or reduce the leakage current of the transistor T7 of the main driver 92, embodiments presented herein apply a higher voltage than the logic high voltage VPERI to the gate of the transistor T7. In some embodiments, a column select voltage VCS is between about 200 mV and about 400 mV, such as about 300 mV, larger than the logic high voltage VPERI. Thus, for example, if the logic high voltage VPERI is about 1.1 volts, the column select voltage VCS is about 1.4 volts.

In the following example, the input signal A 84 and either of the inputs B 88 or C 90 is a logic low (e.g., 0) or transitioning from a logic high to a logic low (e.g., from 1 to 0). If the input signal B 88 is the logic low (or transitioning to the logic low), the transistor T3 pulls up a second node 106 to a logic high voltage (e.g., 1, VPERI). The second node 106 is coupled to a gate of the transistor T10 and a gate of the transistor T11 via the inverter 100. Similarly, if the input signal C 90 is the logic low, the transistor T6 pulls the second node 106 up to the logic high voltage (e.g., 1, VPERI). Thus, when either of the input signals B 88 or C 90 are logic low, the second node 106 is pulled up to the logic high voltage (e.g., 1, VPERI). With the logic high voltage at the second node 106, the transistor T11 couples a third node 108 to a column select voltage (e.g., VCS).

If the input signal A 84 is the logic low, the transistor T1 couples the first node 104 to the third node 108. That is, the first node 104 is pulled up to the column select voltage VCS via the transistors T1 and T11. The column select voltage VCS is applied to a gate of the transistor T7 and a gate of the transistor T8. The column select voltage VCS turns off the transistor T7 and couples a fourth node 110 to a logic low voltage (e.g., 0, VSS) via the transistor T8. That is, the column select signal 102 is the logic low (e.g., 0, VSS). Thus, when the column select circuitry 80 is in a standby state (e.g., off, when the input signal A 84 is the logic low), the column select voltage VCS is applied to the gate of the transistor T7. When the column select circuitry 80 is activated for use, the first node 104 is pulled up to the logic high voltage VPERI via the transistors T1 and T10, T2 and T6, or T2 and T3, depending on the input signals A 84, B 88, and C 90.

When the input signal A 84 is the logic high (e.g., 1), the transistor T1 is off and the transistor T2 couples the first node 104 to the second node 106. When the first node 104 is pulled down to the logic low (e.g., 0, VSS) via the transistors T2, T4, and T5, the column select signal 102 is pulled up to the logic high voltage (e.g., VPERI) via the transistor T7. In that case, the third node 108 is pulled up to the logic high (e.g., VPERI) via the transistor T10.

Accordingly, when the column select voltage VCS is applied to the gate of the transistor T7, the transistor T7 is turned off more (e.g., harder) than when the logic high voltage VPERI is applied to the gate of the transistor T7 due to the larger column select voltage VCS. In this way, current leakage through the transistor T7 is mitigated (e.g., reduced) by applying the column select voltage VCS to the gate thereof. That is, the pre-header circuit 98 improves an operating efficiency of the column select circuitry 80 by reducing leakage current though the transistor T7 of the main driver 92 while enabling a reduction in the physical size of the main driver circuit 92 and the column select circuitry 80 overall.

Figure 4:
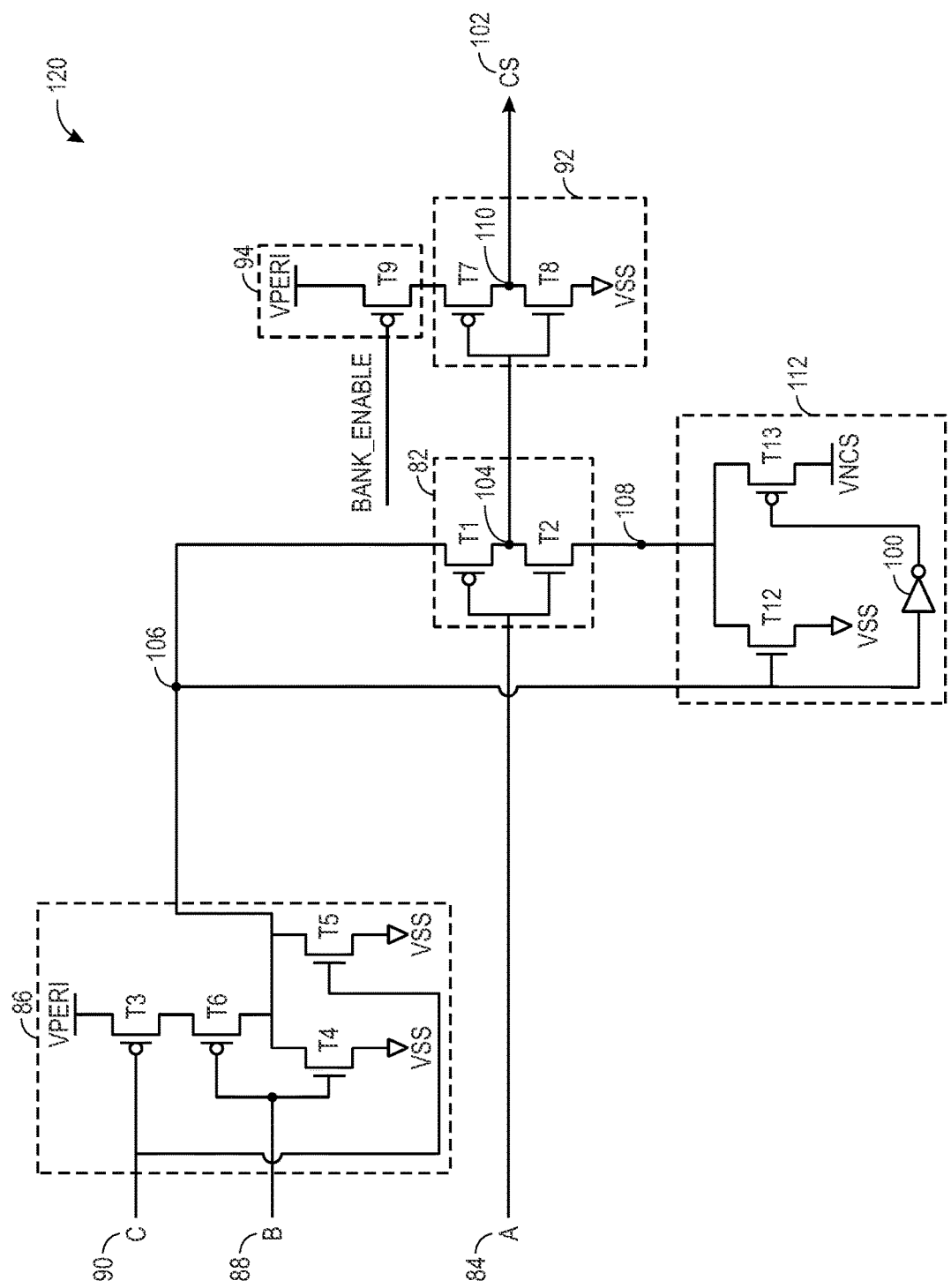
FIG. 4 is a circuit diagram of example column select circuitry including pre-footer circuitry, in accordance with an embodiment of the present disclosure.

FIG. 4 is a circuit diagram of example column select circuitry 120 including a pre-footer circuit 122, in accordance with an embodiment of the present disclosure. The column select circuitry 120 is similar to the column select circuitry 80 discussed with respect to FIG. 3 above. However, the pre-header circuit 98 of the column select circuitry 80 of FIG. 3 is moved to an opposite side of the pre-driver circuit 82 as a pre-footer circuit 112. That is, the third node 108 is coupled to the source of the transistor T2. The pre-footer circuit 122 includes two transistors T12 and T13 which are substantially similar to the transistors T10 and T11, respectively, discussed with respect to FIG. 3. The decoder 86 is moved to an opposite side of the pre-driver circuit 82, compared to the pre-header circuit 98, such that the second node 106 is coupled to the transistor T1 of the pre-driver circuit 82 and a gate of the transistor T12 of the pre-footer circuit. Further, the column select circuitry 120 may be utilized to activate a corresponding column of a memory array when the column select signal 102 is a logic low (e.g., 0, VSS).

With the pre-footer circuit, a negative column select voltage VNCS is applied to the gate of the transistor T8 via the transistors T2 and T13 when the column select circuitry 120 is in a standby state. In that case, the input signal A 84 may be a logic high or an inverter (not shown) may be included on the line for the input signal A 84. The negative column select voltage VNCS may be a negative voltage and thus less than ground (e.g., VSS). In some embodiments, VNCS may be within a range from about −0.2 V to about −0.4 V, such as about −0.3 V.

The pre-footer circuit 112 operates similar to the pre-header circuit 98 in that the negative column select voltage VNCS is applied to the gate of the transistor T8 to turn on the transistor T8 more (e.g., more than VSS or any voltage higher than VNCS applied to the gate of the transistor T8) and thus reduce a leakage current through the transistor T8. Accordingly, similar to the pre-header circuit 98, the pre-footer circuit 112 improves an operating efficiency of the column select circuitry 120 by reducing leakage current though the transistor T7 of the main driver 92 while enabling a reduction in the physical size of the main driver circuit 92 and the column select circuitry 80 overall.

One or more specific embodiments of the present disclosure are described herein and depicted in the corresponding figures. The described embodiments are merely examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A select circuit comprising:
an input configured to receive a first signal;
a first node configured to enable an output of the select circuit;
a second node configured to control a voltage level of the first node;
a decoder circuit configured to receive a second signal and a third signal and configured to selectively couple the second node to a first voltage or a second voltage based on the second signal and the third signal;
a main driver circuit configured to provide the output of the select circuit; and
a pre-header circuit configured to selectively couple the first node to the first voltage or a third voltage based on a voltage level of the second node, wherein a voltage level of the first node is configured to control a leakage current in the main driver circuit.

2. The select circuit of claim 1, comprising a first transistor configured to selectively couple the first node to the pre-header circuit based on the first signal.

3. The select circuit of claim 1, comprising a second transistor configured to selectively couple the first node to the decoder circuit based on the first signal.

4. The select circuit of claim 1, the decoder circuit comprising a first transistor and a second transistor configured to receive the second signal or the third signal, wherein the first transistor is configured to selectively couple the second node to the first voltage and the second transistor is configured to selectively couple the second node to the second voltage.

5. The select circuit of claim 1, wherein the third voltage is greater than the first voltage and the second voltage.

6. The select circuit of claim 1, wherein the main driver circuit comprises a first transistor configured to selectively couple the output to the first voltage based on the voltage level of the first node and a second transistor configured to selectively couple the output to the second voltage based on the voltage level of the first node.

7. The select circuit of claim 6, wherein the pre-header circuit comprises a third transistor configured to selectively couple the first node to the first voltage and a fourth transistor configured to selectively couple the first node to the third voltage, wherein a size of the third transistor and the fourth transistor is less than 1.5 microns ($\mu m$).

8. The select circuit of claim 7, wherein a size of the first transistor is about 10.5 microns ($\mu m$).

9. The select circuit of claim 7, wherein the pre-header circuit comprises an inverter coupled to the second node and the fourth transistor.

10. A memory device comprising:
a memory array comprising a plurality of memory cells arranged in a plurality of memory cell rows and a plurality of memory cell columns, wherein each memory cell of the plurality of memory cells is configured to store a data bit;
row select circuitry configured to identify a memory cell row of the plurality of memory cell rows corresponding to an address of a particular memory cell;
column select circuitry configured to identify a memory cell column of the plurality of memory cell columns corresponding to the address of the particular memory cell, the column select circuitry comprising:
an input configured to receive a first signal;
a first node configured to enable an output of the column select circuit;
a second node configured to control a voltage level of the first node;
a decoder circuit configured to receive a second signal and a third signal and configured to selectively couple the second node to a first voltage or a second voltage based on the second signal and the third signal;
a main driver circuit configured to provide the output of the column select circuit; and
a pre-header circuit configured to selectively couple the first node to the first voltage or a third voltage based on a voltage level of the second node.

11. The memory device of claim 10, the decoder circuit comprising a first transistor and a second transistor configured to receive the second signal or the third signal, wherein the first transistor is configured to selectively couple the second node to the first voltage and the second transistor is configured to selectively couple the second node to the second voltage.

12. The memory device of claim 11, the main driver circuit comprising a third transistor configured to selectively couple the output to the first voltage and a fourth transistor configured to selectively couple the output to the second voltage.

13. The memory device of claim 12, the pre-header circuit comprising a fifth transistor configured to selectively couple the first node to the first voltage, an inverter coupled to the second node, and a sixth transistor coupled to the inverter and configured to selectively couple the first node to the first voltage or the third voltage based on the voltage level of the second node.

14. The memory device of claim 10, comprising a pre-driver circuit including a first transistor configured to selectively couple the first node to the second node based on the first signal and a second transistor configured to selectively couple the first node to the pre-header circuit based on the first signal.

15. The memory device of claim 12, wherein the voltage level of the first node is configured to mitigate a leakage current through the third transistor when the column select circuitry is in a standby state.

16. A memory system comprising:
an input configured to receive a first signal;
a first node configured to enable an output of a select circuit;
a second node configured to control a voltage level of the first node;
a decoder circuit configured to receive a second signal and a third signal and configured to selectively couple the second node to a first voltage or a second voltage based on the second signal and the third signal;
a main driver circuit configured to provide the output of the select circuit;

a pre-driver circuit configured to receive the first signal and configured to selectively provide a voltage level to the first node; and a pre-footer circuit configured to selectively couple the first node to the first voltage or a third voltage based on a voltage level of the second node, wherein a voltage level of the first node is configured to control a leakage current in the main driver circuit.

17. The memory system of claim 16, the decoder circuit comprising a first transistor and a second transistor configured to receive the second signal or the third signal, wherein the first transistor is configured to selectively couple the second node to the first voltage and the second transistor is configured to selectively couple the second node to the second voltage.

18. The memory system of claim 16, wherein the third voltage is less than the first voltage and the second voltage.

19. The memory system of claim 16, the pre-footer circuit comprising a fifth transistor configured to selectively couple the first node to the first voltage, an inverter coupled to the second node, and a sixth transistor coupled to the inverter and configured to selectively couple the first node to the first voltage or the third voltage based on the voltage level of the second node.

20. The memory system of claim 19, comprising a seventh transistor configured to selectively couple the output to the first voltage based on the voltage level of the first node, wherein a size of the seventh transistor is about 10.5 microns (μm), and wherein a size of the fifth transistor and the sixth transistor is less than 1.5 microns (μm).

* * * * *